(12) United States Patent
Wang (10) Patent No.: US 11,937,453 B2
(45) Date of Patent: Mar. 19, 2024

(54) DISPLAY DEVICE, DISPLAY PANEL, AND MANUFACTURING METHOD (71) Applicant: BOE Technology Group Co., Ltd., Beijing (CN)

(72) Inventor: Pinfan Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 643 days.

(21) Appl. No.: 17/252,717

(22) PCT Filed: Jun. 29, 2020

(86) PCT No.: PCT/CN2020/098874
§ 371 (c)(1),
(2) Date: Dec. 15, 2020

(87) PCT Pub. No.: WO2021/000835
PCT Pub. Date: Jan. 7, 2021

(65) Prior Publication Data
US 2021/0202596 A1   Jul. 1, 2021

(30) Foreign Application Priority Data
Jul. 1, 2019 (CN) .......................... 201910585129.6

(51) Int. Cl.
*H10K 59/121* (2023.01)
*H10K 50/844* (2023.01)
(Continued)

(52) U.S. Cl.
CPC ......... *H10K 59/121* (2023.02); *H10K 50/844* (2023.02); *H10K 59/124* (2023.02);
(Continued)

(58) Field of Classification Search
CPC .. H10K 59/121; H10K 59/124; H10K 59/126; H10K 59/65; H10K 59/1201;
(Continued)

(56) References Cited

U.S. PATENT DOCUMENTS

| 10,146,078 B2 | 12/2018 | Li |
| 2016/0190389 A1 | 6/2016 | Lee et al. |

(Continued)

FOREIGN PATENT DOCUMENTS

| CN | 104965365 A | 10/2015 | |
| CN | 106409796 A * | 2/2017 | ........... H01L 23/482 |

(Continued)

OTHER PUBLICATIONS

International Search Report and Written Opinion issued in PCT/CN2018/098874, dated Sep. 16, 2020 and English translation, (6p).

(Continued)

*Primary Examiner* — Sitaramarao S Yechuri
(74) *Attorney, Agent, or Firm* — Arch & Lake LLP (57) ABSTRACT

The present disclosure relates to a display device, a display panel, and a method for manufacturing the display panel. The display panel includes a substrate, a display layer and a light-shielding layer. The display layer includes a driving circuit layer and an insulating planarization layer covering the driving circuit layer which are stacked sequentially on the substrate, the display layer is provided with at least one through hole penetrating through the display layer, and the insulating planarization layer has a side wall close to the at least one through hole. The light-shielding layer covers at least partial region of the side wall of the insulating planarization layer.

17 Claims, 4 Drawing Sheets

(51) Int. Cl.
*H10K 59/124* (2023.01)
*H10K 59/126* (2023.01)
*H10K 59/65* (2023.01)
*H10K 71/00* (2023.01)
*H10K 77/10* (2023.01)
*H10K 59/12* (2023.01)
*H10K 102/00* (2023.01)

(52) U.S. Cl.
CPC ............ *H10K 59/126* (2023.02); *H10K 59/65* (2023.02); *H10K 71/00* (2023.02); *H10K 77/111* (2023.02); *H10K 59/1201* (2023.02); *H10K 2102/311* (2023.02)

(58) Field of Classification Search
CPC ...... H10K 59/00; H10K 59/12; H10K 50/844; H10K 50/856; H10K 71/00; H10K 77/111; H10K 2102/311; Y02E 10/549; Y02P 70/50; H01L 21/77
See application file for complete search history.

(56) References Cited

U.S. PATENT DOCUMENTS

| | | |
|---|---|---|
| 2017/0168347 A1 | 6/2017 | Li |
| 2017/0249886 A1 | 8/2017 | Choi |
| 2017/0278920 A1 | 9/2017 | Park et al. |
| 2020/0105844 A1 | 4/2020 | Wang et al. |

FOREIGN PATENT DOCUMENTS

| | | | | |
|---|---|---|---|---|
| CN | 107452780 A | | 12/2017 | |
| CN | 107706208 A | | 2/2018 | |
| CN | 107731888 A | * | 2/2018 | ............ H01L 21/77 |
| CN | 107871761 A | | 4/2018 | |
| CN | 109300957 A | | 2/2019 | |
| CN | 110265470 A | | 9/2019 | |
| KR | 20140098401 A | * | 8/2014 | ......... G02F 1/13394 |

OTHER PUBLICATIONS

First Chinese Office Action issued to Chinese Application No. 201910585129.6, dated Jan. 29, 2021 with English translation, (16p).

International Search Report and Written Opinion issued in PCT/CN2020/098874 dated Sep. 16, 2020 and English translation, (6p).

* cited by examiner

Form a display layer on a substrate, wherein the display layer includes a driving circuit layer and an insulating planarization layer covering the driving circuit layer which are stacked sequentially on the substrate, the display layer is provided with at least one through hole penetrating through the display layer, and the insulating planarization layer has a side wall close to the at least one through hole — S110

Form a light-shielding layer on at least partial region of the side wall of the insulating planarization layer — S120

DISPLAY DEVICE, DISPLAY PANEL, AND MANUFACTURING METHOD

CROSS-REFERENCE OF RELATED APPLICATIONS

This application is the 371 application of PCT Application No. PCT/CN2020/098874, filed Jun. 29, 2020 which claims priority to Chinese patent application No. 201910585129.6 filed on Jul. 1, 2019, the contents of both of which are incorporated by reference herein in their entireties for all purposes.

TECHNICAL FIELD

The present disclosure relates to display technologies, and in particular, to a display device, a display panel, and a method for manufacturing the display panel.

BACKGROUND

In related art, a display panel may be provided with an opening, for example, a display panel used for a mobile phone is provided with an opening for placing a camera. At present, the driving device commonly used in display panels is a thin film transistor (TFT), which generally includes an active layer, a gate insulating layer, a gate electrode, a source electrode and a drain electrode, etc. The active layer, especially the channel region of the active layer, is sensitive to light, and its performance is easily influenced by light. For the display panels, the performance of the driving device directly affects the display effect.

It should be noted that the information disclosed in the Background section above is only for enhancing the understanding of the background of the present disclosure, and thus may include information that does not constitute prior art known to those of ordinary skill in the art.

SUMMARY

Embodiments of the present disclosure provides a display device, a display panel, and a method for manufacturing the display panel, which can avoid the influence of light on the driving device to a certain extent, and accordingly improve the display effect.

According to an aspect of the present disclosure, there is provided a display panel, including:
a substrate;
a display layer including a driving circuit layer and an insulating planarization layer covering the driving circuit layer which are stacked sequentially on the substrate, wherein the display layer is provided with at least one through hole penetrating the display layer, and the insulating planarization layer has a side wall close to the at least one through hole; and
a light-shielding layer covering at least partial region of the side wall of the insulating planarization layer.

According to an exemplary embodiment of the present disclosure, the at least one through hole penetrates through the substrate, and the side wall of the insulating planarization layer surrounds the at least one the through hole.

According to an exemplary embodiment of the present disclosure, the substrate is made of a flexible material, the at least one through hole penetrate through the substrate, and the display panel is divided by the at least one through hole into a plurality of pixel islands arranged in an array and bridge regions connecting the pixel islands;

each of the pixel islands includes an island region driving circuit layer, the island region driving circuit layer is a region of the driving circuit layer which is located in the each of the pixel islands, and island region driving circuit layers are connected with each other by a lead in a corresponding one of the bridge regions;
the side wall of the insulating planarization layer surrounds the island region driving circuit layers.

According to an exemplary embodiment of the present disclosure, the display layer further includes:
a light-emitting unit layer disposed on a side of the insulating planarization layer away from the driving circuit layer, wherein the light-emitting unit layer includes a first electrode layer, and the first electrode layer and the light-shielding layer are made of a same material and are both disposed on a surface of the insulating planarization layer away from the substrate.

According to an exemplary embodiment of the present disclosure, the light-shielding layer is made of a material including at least one of silver and aluminum.

According to an exemplary embodiment of the present disclosure, each of the island region driving circuit layers includes:
an active layer disposed on the substrate;
a gate insulating layer covering the active layer and the substrate;
a gate electrode disposed on a surface of the gate insulating layer away from the substrate;
a dielectric layer covering the gate electrode and the gate insulating layer;
a source-drain layer disposed on a surface of the dielectric layer away from the substrate and including a source electrode and a drain electrode; and
the insulating planarization layer covering the source-drain layer and the dielectric layer.

According to an exemplary embodiment of the present disclosure, the light-emitting unit layer further includes:
a light-emitting layer disposed on a surface of the first electrode layer away from the substrate; and
a second electrode layer disposed on a surface of the light-emitting layer away from the substrate.

According to an exemplary embodiment of the present disclosure, the display layer further includes:
an encapsulation layer disposed on a side of the light-emitting unit layer away from the substrate.

According to another aspect of the present disclosure, there is provided a method for manufacturing a display panel, including:
forming a display layer on a substrate, wherein the display layer includes a driving circuit layer and an insulating planarization layer covering the driving circuit layer which are stacked sequentially on the substrate, the display layer is provided with at least one through hole penetrating the display layer, and the insulating planarization layer has a side wall close to the at least one through hole; and
forming a light-shielding layer on at least partial region of the side wall of the insulating planarization layer.

According to an exemplary embodiment of the present disclosure, the at least one through hole penetrates through the substrate, and the side wall of the insulating planarization layer surrounds the at least one the through hole.

According to an exemplary embodiment of the present disclosure, the substrate is made of a flexible material, the at least one through hole penetrate through the substrate, and the display panel is divided by the at least one through hole into a plurality of pixel islands arranged in an array and bridge regions connecting the pixel islands;

each of the pixel islands includes an island region driving circuit layer, the island region driving circuit layer is a region of the driving circuit layer which is located in the each of the pixel islands, and island region driving circuit layers are connected with each other by a lead in a corresponding one of the bridge regions;

the side wall of the insulating planarization layer surrounds the island region driving circuit layers.

According to an exemplary embodiment of the present disclosure, the display layer further includes:

a light-emitting unit layer disposed on a side of the insulating planarization layer away from the driving circuit layer, wherein the light-emitting unit layer includes a first electrode layer, and the first electrode layer and the light-shielding layer are made of a same material and are both formed on a surface of the insulating planarization layer away from the substrate by one patterning process.

According to an exemplary embodiment of the present disclosure, the light-emitting unit layer further includes:

a light-emitting layer disposed on a surface of the first electrode layer away from the substrate; and a second electrode layer disposed on a surface of the light-emitting layer away from the substrate.

According to another aspect of the present disclosure, there is provided a display device, including the display panel according to any one of the above embodiments.

In the display device, the display panel and the method for manufacturing the display panel according to embodiments of the present disclosure, since the light-shielding layer is provided in at least a part of the side wall of the insulating planarization layer close to the at least one through hole, light can be shielded by the light-shielding layer, and light entering the driving circuit layer is reduced. Thus, embodiments of the present disclosure can prevent the performance of the driving device from changing due to light, and therefore the performance of the driving device is more stable, which is beneficial to improve the display effect.

It should be understood that the above general description and the following detailed description are only exemplary and explanatory, and cannot be construed as constituting limitation on the present disclosure.

BRIEF DESCRIPTION OF THE DRAWINGS

The drawings, which are incorporated into the specification and constitute a part of the specification, show embodiments consistent with the present disclosure, and are used to explain the principles of the disclosure together with the specification. Obviously, the drawings in the following description are only some examples of the present disclosure. For those of ordinary skill in the art, other drawings can be obtained from these drawings without creative work.

LISTING OF REFERENCE SIGNS

1: substrate; 2: display layer; 200: pixel island; 201: through hole; 202: lead; 21: driving circuit layer; 211: active layer; 212: gate insulating layer; 213: gate electrode; 214: dielectric layer; 2141: interlayer insulating layer; 2142: interlayer dielectric layer; 215, source electrode; 216: drain electrode; 217: insulating planarization layer; 22: first electrode; 23: light-emitting layer; 24: second electrode; 3: light-shielding layer; 4: blocking layer; 5: buffer layer; 6: encapsulation layer.

DETAILED DESCRIPTION

Example embodiments will now be described more fully with reference to the drawings. However, the example embodiments can be implemented in various forms, and should not be construed as being limited to the examples set forth herein; on the contrary, the provision of these embodiments makes the present disclosure more comprehensive and complete, and fully conveys the concept of the example embodiments to those skilled in the art. Same reference signs in the drawings represent same or similar structures, and repeated descriptions thereof will be omitted. Further, the drawings only provide schematic diagrams of embodiments of the present disclosure, and are not necessarily drawn to scale.

Although the relative terms such as "above" and "below" are used in the specification to describe the relative relationship of one component to another component shown, these terms are only for convenience in this specification, for example, according to an exemplary direction shown in the drawings. It will be understood that if a device shown is flipped upside down, the component described as "above" will become a component "below" another component. When a structure is "on" another structure, it may mean that a structure is integrally formed on another structure, or that a structure is "directly" disposed on another structure, or that a structure is "indirectly" disposed on another structure through other structures.

The terms like "one", "a", "the", "said", and "an" are used to indicate that there are one or more elements/components or the like; the terms "include", "contain" and "have" are used to indicate an open meaning of including and means that there may be additional elements/components/etc. in addition to the listed elements/components/etc.; the terms "first", "second" and "third" etc. are used only as markers, and do not limit the number of objects.

Figure 1:
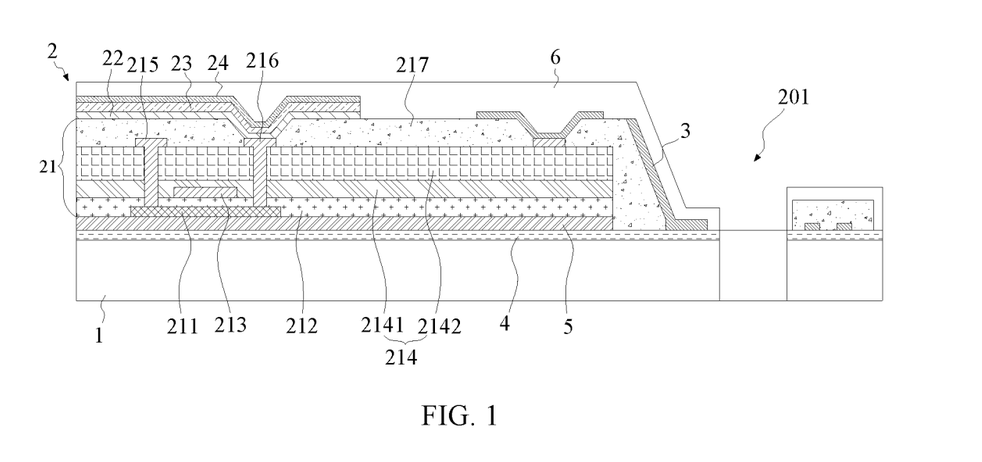
FIG. 1 is a schematic cross-sectional view of a display panel according to an embodiment of the present disclosure.
Figure 2:
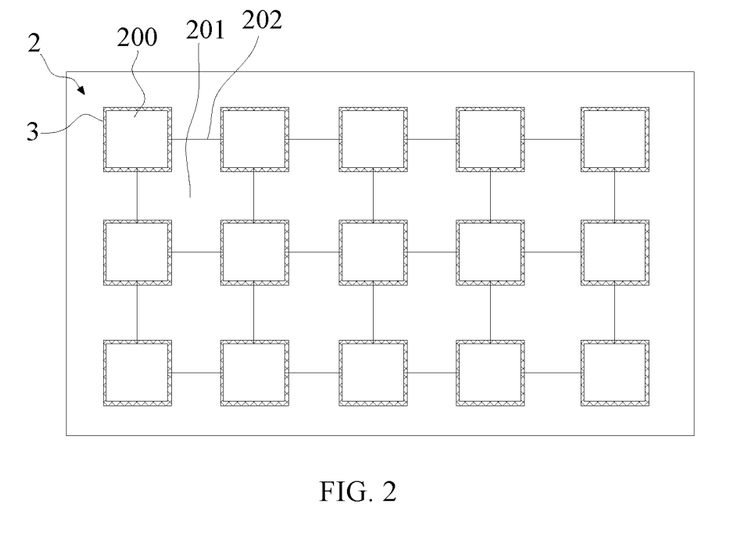
FIG. 2 is a schematic top view of the embodiment in FIG. 1.
Figure 3:
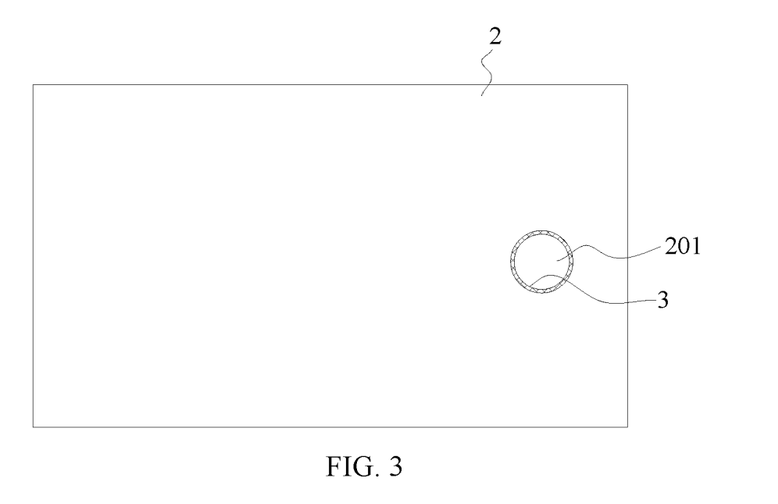
FIG. 3 is a schematic top view of a display panel according to another embodiment of the present disclosure.

An embodiment of the present disclosure provides a display panel, as shown in FIGS. 1 to 3. The display panel includes a substrate, a display layer 2 and a light-shielding layer 3. The display layer 2 includes a driving circuit layer and an insulating planarization layer 217, and the driving circuit layer and the insulating planarization layer 217 are stacked sequentially on the substrate 1. The insulating planarization layer 217 covers the driving circuit layer and is disposed on a side of the driving circuit layer away from the substrate 1. The display layer 2 is provided with at least one through hole 201 penetrating through the display layer 2, and the insulating planarization layer 217 has a side wall close to the at least one through hole 201. The light-shielding layer 3 covers at least partial region of the side wall of the insulating planarization layer 217.

In the display device according to the embodiment of the present disclosure, since the light-shielding layer 3 is provided in at least a part of the side wall of the insulating planarization layer 217 close to the at least one through hole 201, light can be shielded by the light-shielding layer 3, and light entering the driving circuit layer is reduced. Thus, the embodiment of the present disclosure can prevent the performance of the driving device from changing due to light, and therefore the performance of the driving device is more stable, which is beneficial to improve the display effect.

As shown in FIG. 1, the material of the substrate 1 may be a hard material such as glass, or a flexible material such as PET (polyethylene terephthalate), and the shape and size of the substrate 1 are not specifically limited here.

As shown in FIG. 1, the display layer 2 is provided on the substrate 1. The display layer 2 can be directly laminated on a surface of the substrate 1. Alternatively, a blocking layer 4 and a buffer layer 5 can be sequentially laminated on a surface of the substrate 1, and the display layer 2 can be laminated on a surface of the buffer layer 5 away from the substrate 1. The blocking layer 4 and the buffer layer 5 are both made of insulating materials.

The display layer 2 includes a driving circuit layer and an insulating planarization layer 217. The driving circuit layer is provided on the substrate 1. The display layer 2 is provided with at least one through hole 201. There may be one or more through holes 201, and the shape of the one or more through holes 201 can be circles, or rectangles, or strips extending along a curved or a polyline trace, and embodiments of the present disclosure do not impose specific limitations on this. The through holes 201 penetrate through at least the display layer 2, and can further penetrate through the substrate 1. The size of the portion of the through holes 201 located in the substrate 1 and the size of the portion of the through holes 201 located in the display layer 2 may be different.

The insulating planarization layer 217 has a side wall close to the through holes 201. For example, a through hole 201 is surrounded by the side wall of the insulating planarization layer 217, that is, the side wall of the insulating planarization layer 217 is the inner wall of the through hole 201. The size and shape of the side wall are not specifically limited here.

The light-shielding layer 3 is made of an opaque material, such as silver, or aluminum, etc., which will not be listed here. The light-shielding layer 3 covers at least part of the side wall of the insulating planarization layer 217, for example, covers the side wall of the driving circuit layer, thereby reducing the light entering the driving circuit layer via the through holes 201 and preventing the performance of the driving device from being affected by light.

In addition, the display layer 2 may also include a light-emitting unit layer disposed on a side of the insulating planarization layer 217 away from the driving circuit layer. The light-emitting unit layer includes a first electrode layer, the first electrode layer and the light-shielding layer are made of the same material and both are arranged on a surface of the insulating planarization layer 217 away from the substrate 1, so that the first electrode layer and the light-shielding layer can be formed in one patterning process, thereby simplifying the process.

The light-emitting unit layer may further include a light-emitting layer and a second electrode layer. The light-emitting layer is provided on a surface of the first electrode layer away from the substrate 1, and the second electrode layer is provided on a surface of the light-emitting layer away from the substrate 1. The light-emitting layer can be driven to emit light by the first electrode layer and the second electrode layer to display images.

In addition, the display panel according to embodiments of the present disclosure may further include an encapsulation layer 6, which may be disposed on a side of the light-emitting unit layer away from the substrate 1, so as to wrap the light-emitting unit layer and prevent water and oxygen corrosion. The encapsulation layer 6 can be a single-layer or multi-layer structure, and the material of the encapsulation layer 6 can include an organic or inorganic material, which are not specifically limited herein.

The following is a detailed description. In the following examples, the display panel is a stretchable display panel.

As shown in FIG. 1 and FIG. 2, in the display panel, the substrate 1 is made of a flexible material, and there are multiple through holes 201. The through holes 201 are all strip structures extending along a curved or polyline trace. The shapes of the through holes 201 can be different. The through holes 201 divide the display layer 2 into a plurality of pixel islands 200 and bridge regions connecting the pixel islands 200. Each pixel island 200 has one or more pixels. FIGS. 1 and 2 show a pixel island 200 and an adjacent through hole 201. Each pixel island 200 includes an island region driving circuit layer 21 and a first electrode 22.

The island region driving circuit layer 21 is a region of the driving circuit layer which is located in the pixel island 200. The side wall of the island region driving circuit layer 21 is a part of the side wall of the through hole 201. Any two adjacent island region driving circuit layers 21 can be electrically connected to each other by a lead 202 arranged in a corresponding bridge region. The island region driving circuit layer 21 may include a plurality of thin film transistors, and the thin film transistors may be of a top gate type or a bottom gate type. Taking a top gate thin film transistor as an example, the island region driving circuit layer 21 may include an active layer 211, a gate insulating layer 212, a gate electrode 213 and a source-drain layer.

The active layer 211 is provided on the substrate 1, and the material of the active layer 211 may be polysilicon, amorphous silicon, etc., and the active layer 211 may include a channel region and two doped regions of different doping types located on both sides of the channel region.

The gate insulating layer 212 may cover the active layer 211 and the substrate 1, and the material of the gate insulating layer 212 is an insulating material such as silicon oxide.

The gate electrode 213 is arranged on a surface of the gate insulating layer 212 away from the substrate 1 and is directly opposite to the active layer 211, that is, the projection of the gate electrode 213 on the substrate 1 is located within the projection range of the active layer 211 on the substrate 1. For example, the projection of the gate electrode 213 on the substrate 1 coincides with the projection of the channel region of the active layer 211 on the substrate 1.

The dielectric layer 214 covers the gate electrode 213 and the gate insulating layer 212. For example, the dielectric layer 214 may include an interlayer insulating layer 2141 and an interlayer dielectric layer 2142 that are sequentially stacked in a direction away from the substrate 1. Both the interlayer insulating layer 2141 and the interlayer dielectric layer 2142 are made of insulating materials, but the materials of the interlayer insulating layer 2141 and the interlayer dielectric layer 2142 can be different. Alternatively, the dielectric layer 214 can be a single-layer structure.

The source-drain layer is disposed on a surface of the dielectric layer 214 away from the substrate 1, and the source-drain layer includes a source electrode 215 and a drain electrode 216. The source electrode 215 and the drain electrode 216 are directly opposite and connected to the active layer 211, for example, the source electrode 215 and the drain electrode 216 are respectively connected to the two doped regions of the corresponding active layer 211 through via holes.

The insulating planarization layer 217 of the display layer 2 can cover the dielectric layer 214 and the source-drain layer, and a surface of the insulating planarization layer 217 away from the substrate 1 is flat. The outer peripheral surface of the insulating planarization layer 217, that is, the side wall of the insulating planarization layer 217, is a part of the side wall of a through hole 201.

As shown in FIG. 1, the display panel may further include a light-emitting unit layer. The light-emitting unit layer includes a first electrode layer, a light-emitting layer, and a second electrode layer. A region of the light-emitting unit layer which is located in each pixel island 200 is a light-emitting unit. Each light-emitting unit includes a first electrode 22. The first electrode 22 is a region of the first electrode layer which is located in the pixel island 200 and is located on a surface of the island region driving circuit layer 21 away from the substrate 1. For example, the first electrode 22 is provided on a surface of the insulating planarization layer 217 away from the substrate 1. In addition, the first electrode 22 is connected to the drain electrode 216. The material of the first electrode 22 may include at least one of silver and aluminum, and of course, may also include other materials.

As shown in FIGS. 1 and 2, the light-shielding layer 3 surrounds and covers at least a part of the side wall of the insulating planarization layer 217, thereby enclosing the island region driving circuit layer 21 along the circumferential direction and preventing the light in the through hole 201 from entering the island region driving circuit layer 21. Accordingly, the active layer 211 is prevented from being affected by light, and the performance of the thin film transistors is stable. The material of the light-shielding layer 3 can be the same as that of the first electrode 22. The light-shielding layer 3 and the first electrode 22 are both provided on a surface of the insulating planarization layer 217 away from the substrate 1, and thus the light-shielding layer 3 and the first electrode 22 can be formed in one patterning process. The one patterning process can be a photolithography process.

As shown in FIG. 1, the light-emitting layer may include organic electroluminescent materials, and may be formed by evaporation or other processes. For example, the light-emitting layer may include a hole injection layer, a hole transport layer, an organic light-emitting layer, an electron transport layer, and an electron injection layer that are sequentially stacked on the first electrode layer. Correspondingly, the pixel island 200 further includes a light-emitting portion 23 and a second electrode 24.

The light-emitting layer 23 is provided on a surface of the first electrode 22 away from the substrate 1, and the region of the light-emitting layer located in a pixel island is the light-emitting portion. The light-emitting portion does not necessarily overlap with the first electrode 22 completely, and its range can be larger than that of the first electrode 22.

As shown in FIG. 1, the second electrode 24 may be provided on a surface of the light-emitting layer 23 away from the substrate 1, and the second electrode 24 is the region of the second electrode layer which is located in a pixel island 200. The material of the second electrode 24 may be a conductive material such as metal, which is not particularly limited here.

The second electrode 24 can be used as a cathode, and the first electrode 22 can be used as an anode. The light-emitting layer 23 can be driven to emit light by applying a signal to the first electrode 22. The specific light-emitting principle will not be described in detail here.

In another embodiment of the present disclosure, as shown in FIG. 3, the display panel is not a stretchable flexible display panel. The display layer may include a driving circuit layer, an insulating planarization layer and a light-emitting unit layer. The driving circuit layer can be provided on the substrate. The insulating planarization layer covers the driving circuit layer. The light-emitting unit layer includes a first electrode layer, a light-emitting layer and a second electrode layer. The first electrode layer, the light-emitting layer and the second electrode layer are sequentially stacked on a side of the driving circuit layer away from the substrate 1. The driving circuit layer may include a plurality of driving devices, which may be thin film transistors. The light-emitting layer may include a hole injection layer, a hole transport layer, an organic light-emitting layer, an electron transport layer and an electron injection layer which are sequentially stacked on the first electrode layer. By the driving devices, driving signals can be applied to the first electrode layer, and the light-emitting layer can be driven to emit light with the cooperation of the second electrode layer. The specific light-emitting principle is not described in detail here.

The through hole 201 penetrates through the display layer 2 and can further penetrates through the substrate 1. A camera module can be disposed in the through hole 201. The through hole 201 can be a regular shape such as a circle, an ellipse, or a polygon. The light-shielding layer 3 covers the side wall of the insulating planarization layer 217, that is, the side wall of the through hole 201, so as to prevent light from entering the driving circuit layer from the through hole 201.

Figure 4:
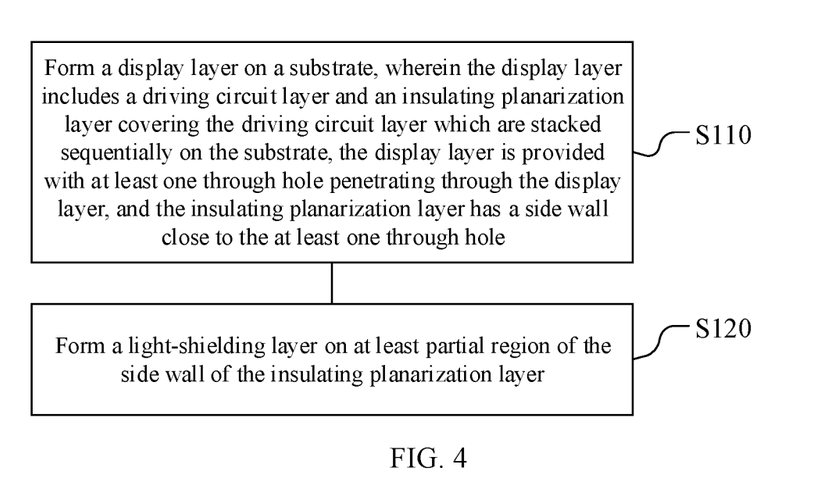
FIG. 4 is a flowchart of a method for manufacturing a display panel according to another embodiment of the present disclosure.

An embodiment of the present disclosure provides a method for manufacturing a display panel, which may be the above-mentioned display panel. As shown in FIG. 4, the manufacturing method includes steps S110 and S120.

In step S110, a display layer is formed on a substrate. The display layer includes a driving circuit layer and an insulating planarization layer covering the driving circuit layer which are stacked sequentially on the substrate, the display layer is provided with at least one through hole penetrating the display layer, and the insulating planarization layer has a side wall closes to the at least one through hole.

In step S120, a light-shielding layer is formed on at least partial region of the side wall of the insulating planarization layer.

As shown in FIG. 1, the display layer 2 is provided on the substrate 1. The display layer 2 can be directly laminated on a surface of the substrate 1. Alternatively, a blocking layer 4 and a buffer layer 5 can be sequentially laminated on a surface of the substrate 1, and the display layer 2 can be laminated on a surface of the buffer layer 5 away from the substrate 1. The blocking layer 4 and the buffer layer 5 are both made of insulating materials.

The display layer 2 includes a driving circuit layer and an insulating planarization layer 217. The driving circuit layer is provided on the substrate 1. The display layer 2 is provided with at least one through hole 201. There may be one or more through holes 201, and the shape of the one or more through holes 201 can be circles, or rectangles, or strips extending along a curved or a polyline trace, and embodiments of the present disclosure do not impose specific limitations on this. The through holes 201 penetrate through at least the display layer 2, and can further penetrate through the substrate 1. The size of the portion of the through holes 201 located in the substrate 1 and the size of the portion of the through holes 201 located in the display layer 2 may be different.

The insulating planarization layer 217 has a side wall close to the through holes 201. For example, a through hole 201 is surrounded by the side wall of the insulating planarization layer 217. The size and shape of the side wall are not specifically limited here.

As shown in FIG. 1 to FIG. 3, the light-shielding layer 3 is made of an opaque material, such as silver, or aluminum, etc., which will not be listed here. The light-shielding layer 3 covers at least part of the side wall of the insulating planarization layer 217, for example, covers the outer peripheral surface of the driving circuit layer, thereby reducing the light entering the driving circuit layer via the through holes 201 and preventing the performance of the driving device from being affected by light.

The following takes the stretchable display panel in the above embodiment as an example to describe the manufacturing method in detail:

As shown in FIG. 1 and FIG. 2, in the display panel, the substrate 1 is made of a flexible material, and there may be multiple through holes 201. The through holes 201 divide the display layer 2 into multiple pixel islands 200 and bridge regions connecting the pixel islands 200. Any two adjacent island region driving circuit layers 21 can be electrically connected to each other by a lead 202 arranged in a corresponding bridge region. Each pixel island 200 has one or more pixels. FIG. 1 and FIG. 2 show a pixel island 200 and an adjacent through hole 201, and each pixel island 200 includes an island region driving circuit layer 21 and a first electrode 22. For the specific structure of the display panel, reference may be made to the above-mentioned implementations of the display panel, which will not be described in detail here.

In step S110, the display layer is formed on the substrate. The display layer includes a driving circuit layer and an insulating planarization layer covering the driving circuit layer which are sequentially stacked on the substrate, and the display layer is provided with at least one through hole penetrating through the display layer, and the insulating planarization layer has a side wall close to the through hole.

Figure 5:
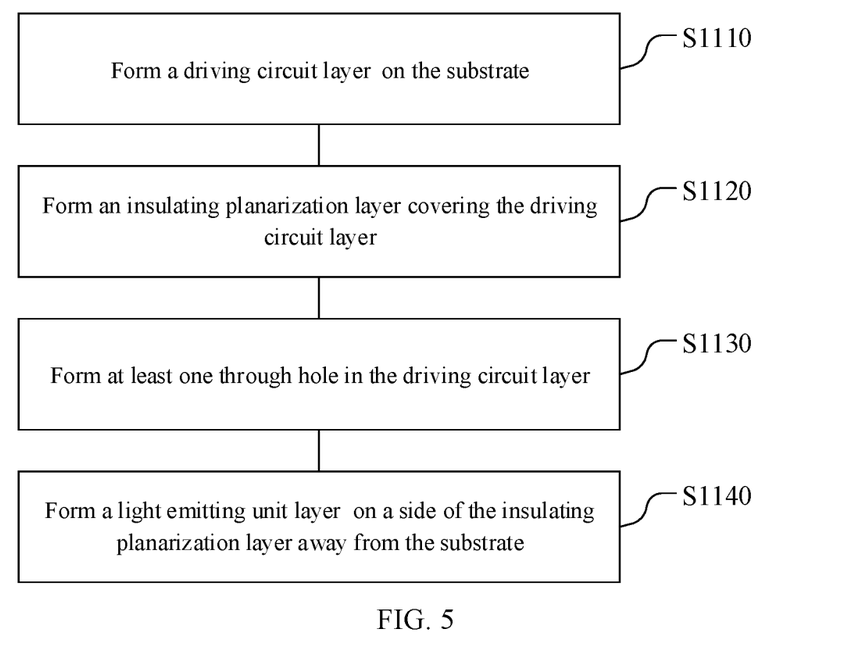
FIG. 5 is a flowchart of step S110 of the manufacturing method in FIG. 4.

As shown in FIG. 5, step S110 includes step S1110 to step S1130.

In step S1110, a driving circuit layer is formed on the substrate.

As shown in FIG. 1 and FIG. 2, the driving circuit layer has a plurality of pixel island regions and a plurality of opening regions, the pixel island regions correspond to the pixel islands one to one, and the opening regions correspond to the through holes 201 one to one. Step S1110 includes step S11110 to step S11150.

In step S11110, an active layer of each pixel island is formed on the substrate.

In step S11120, a gate insulating layer of each pixel island that covers each active layer and the substrate is formed.

In step S11130, the gate electrode of each pixel island is formed on a surface of each gate insulating layer away from the substrate.

In step S11140, a dielectric layer of each pixel island covering each gate electrode and each gate insulating layer is formed.

In step S11150, a source-drain layer of each pixel island is formed on a surface of each dielectric layer away from the substrate, and the source-drain layer includes a source electrode and a drain electrode.

In step S1120, an insulating planarization layer covering the driving circuit layer is formed.

The insulating planarization layer covers the source-drain layers and the dielectric layers.

In step S1130, at least one through hole is formed in the driving circuit layer.

As shown in FIGS. 1 and 2, the at least one through hole 201 is provided in a region of the driving circuit layer for arranging the through hole 201. The shape of the through hole 201 can be a strip extending along a curved or a polyline trace. The at least one through hole 201 at least penetrates through the driving circuit layer, and the at least one through hole 201 can divide the driving circuit layer into a plurality of island region driving circuit layers 21. The at least one through hole can also penetrate through the substrate 1. The formation of the at least one through hole 201 can be achieved by a masking process or other processes capable of forming holes, and is not specifically limited herein.

In addition, step S110 may further include step S1140.

In step S1140, a light emitting unit layer is formed on a side of the insulating planarization layer away from the substrate.

Each pixel island further includes a light-emitting unit, which is a region of the light-emitting unit layer which is located in each pixel island. The light-emitting unit layer includes a first electrode layer, a light-emitting layer, and a second electrode layer. Step S1140 includes step S11410 to step S11430.

In step S11410, a first electrode layer is formed on a surface of the insulating planarization layer away from the substrate.

As shown in FIG. 1, each pixel island includes a first electrode 22. The first electrode 22 is a region of the first electrode layer which is located in each pixel island, that is, the region on a surface of the island region driving circuit layer 21. The first electrode 22 is located on a surface of the insulating layer 217 of each pixel island away from the substrate 1. Also, the first electrode 22 is connected to the drain 216 of a corresponding island region driving circuit layer 21. The material of the first electrode 22 may include at least one of silver and aluminum, and of course, may also include other materials.

In step S11420, a light-emitting layer is formed on a surface of the first electrode layer away from the substrate;

Each pixel island also includes a light-emitting portion, and the light-emitting portion is a region of the light-emitting layer which is located in each pixel island, that is, a region on a surface of the first electrode 22 away from the substrate 1.

In step S11430, a second electrode layer is formed on a surface of the light-emitting layer away from the substrate.

As shown in FIG. 1, each pixel island further includes a second electrode 24, and the second electrode 24 is a region of the second electrode layer which is located in the pixel island.

In step S120, a light-shielding layer is formed on at least partial region of the side wall of the insulating planarization layer.

As shown in FIGS. 1 and 2, the light-shielding layer 3 surrounds and covers at least a part of the side wall of the insulating planarization layer 217, i.e., covering at least a part of the side wall of the through hole 201, thereby enclosing the island region driving circuit layer 21 along the circumferential direction and preventing the light in the through hole 201 from entering the island region driving circuit layer 21. Accordingly, the active layer 211 is prevented from being affected by light, and the performance of the thin film transistors is stable. The material of the light-shielding layer 3 can be the same as that of the first electrode 22. The light-shielding layer 3 and the first electrode 22 are both provided on a surface of the insulating planarization layer 217 away from the substrate 1, and thus the light-shielding layer 3 and the first electrode 22 can be formed in one patterning process. That is, step S11420 and step S120 can be completed at the same time. The one patterning process can be a photolithography process.

Figure 6:
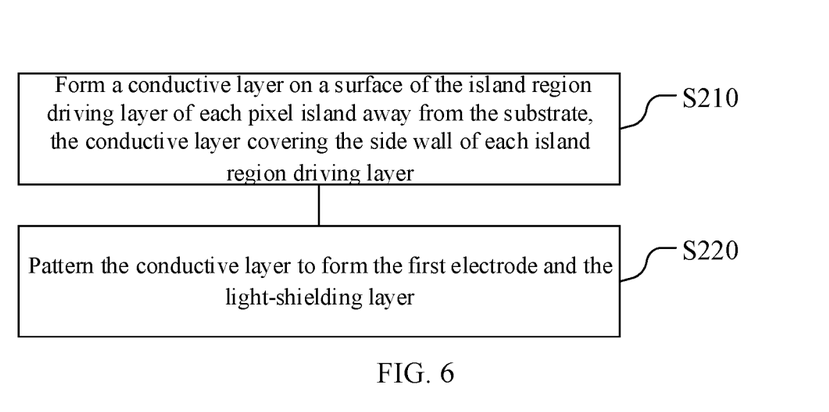
FIG. 6 is a flowchart which shows manufacturing of a first electrode and a light-shielding layer by one patterning process in the manufacturing method according to another embodiment of the present disclosure.

Specifically, as shown in FIG. 6, the first electrode 22 and the light-shielding layer 3 of each pixel island are formed. Step S210 and step S220 are included.

In step S210, a conductive layer is formed on a surface of the island region driving layer of each pixel island away from the substrate, and the conductive layer covers the side wall of each island region driving layer.

In step S220, the conductive layer is patterned to form the first electrode and the light-shielding layer.

Figure 7:
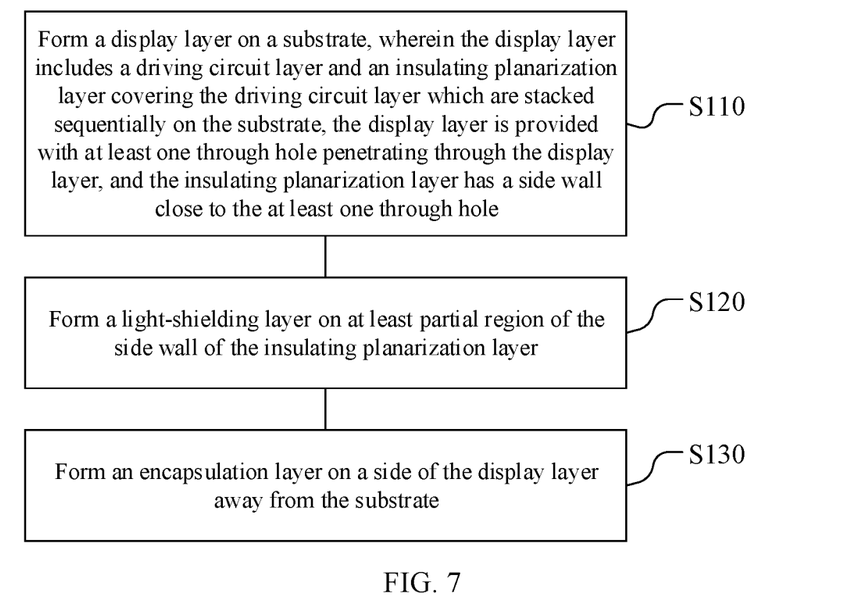
FIG. 7 is a flowchart of a method for manufacturing a display panel according to an embodiment of the present disclosure.

In addition, as shown in FIG. 7, the manufacturing method of the present disclosure may further include:

In step S130, an encapsulation layer is formed on a side of the display layer away from the substrate.

For the specific structure of the encapsulation layer, please refer to the above description of the encapsulation layer, which will not be repeated here.

It should be noted that although various steps of the methods in the present disclosure are described in a specific order in the drawings, this does not require or imply that these steps must be performed in the specific order, or that all the steps shown must be performed to achieve the desired result. Additionally or alternatively, some steps may be omitted, multiple steps may be combined into one step, and/or one step may be decomposed into multiple steps, etc.

An embodiment of the present disclosure also provides a display device including the display panel according to the above embodiments. The display device can be used in electronic devices such as mobile phones, watches, tablet computers, etc., and embodiments of the present disclosure do not impose specific limitations on this. Further, the beneficial effects of the display device can be referred to the beneficial effects of the display panel in the above embodiments, which will not be described in detail here.

Other embodiments of the present disclosure will be apparent to those skilled in the art after those skilled in the art consider the specification and practice the technical solutions disclosed herein. The present disclosure is intended to cover any variations, uses, or adaptations of the present disclosure, which are in accordance with the general principles of the present disclosure and include common general knowledge or conventional technical means in the art that are not disclosed in the present disclosure. The specification and embodiments are illustrative, and the real scope and spirit of the present disclosure is defined by the appended claims.

What is claimed is:

1. A display panel, comprising:
   a substrate;
   a display layer comprising a driving circuit layer and an insulating planarization layer covering the driving circuit layer which are stacked sequentially on the substrate, wherein the display layer is provided with at least one through hole penetrating through the display layer, and the insulating planarization layer has a side wall close to the at least one through hole; and
   a light-shielding layer covering at least partial region of the side wall of the insulating planarization layer;
   wherein the substrate is made of a flexible material, the at least one through hole penetrate through the substrate, and the display panel is divided by the at least one through hole into a plurality of pixel islands arranged in an array and bridge regions connecting the pixel islands;
   wherein each of the pixel islands comprises an island region driving circuit layer, the island region driving circuit layer is a region of the driving circuit layer which is located in the each of the pixel islands, and island region driving circuit layers are connected with each other by a lead in a corresponding one of the bridge regions;
   wherein the side wall of the insulating planarization layer surrounds the island region driving circuit layers.

2. The display panel according to claim 1, wherein the at least one through hole penetrates through the substrate, and the side wall of the insulating planarization layer surrounds the at least one the through hole.

3. The display panel according to claim 2, wherein the display layer further comprises:
   a light-emitting unit layer disposed on a side of the insulating planarization layer away from the driving circuit layer, wherein the light-emitting unit layer comprises a first electrode layer, and the first electrode layer and the light-shielding layer are made of a same material and are both disposed on a surface of the insulating planarization layer away from the substrate.

4. The display panel according to claim 3, wherein the light-shielding layer is made of a material comprising at least one of silver and aluminum.

5. The display panel according to claim 3, wherein the light-emitting unit layer further comprises:
   a light-emitting layer disposed on a surface of the first electrode layer away from the substrate; and
   a second electrode layer disposed on a surface of the light-emitting layer away from the substrate.

6. The display panel according to claim 3, wherein the display layer further comprises:
   an encapsulation layer disposed on a side of the light-emitting unit layer away from the substrate.

7. The display panel according to claim 1, wherein each of the island region driving circuit layers comprises:
   an active layer disposed on the substrate;
   a gate insulating layer covering the active layer and the substrate;
   a gate electrode disposed on a surface of the gate insulating layer away from the substrate;
   a dielectric layer covering the gate electrode and the gate insulating layer;
   a source-drain layer disposed on a surface of the dielectric layer away from the substrate and comprising a source electrode and a drain electrode; and
   the insulating planarization layer covering the source-drain layer and the dielectric layer.

8. A method for manufacturing a display panel, comprising:
   forming a display layer on a substrate, wherein the display layer comprises a driving circuit layer and an insulating planarization layer covering the driving circuit layer which are stacked sequentially on the substrate, the display layer is provided with at least one through hole penetrating through the display layer, and the insulating planarization layer has a side wall close to the at least one through hole;

wherein a light-shielding layer is formed on at least partial region of the side wall of the insulating planarization layer;

wherein the substrate is made of a flexible material, the at least one through hole penetrate through the substrate, and the display panel is divided by the at least one through hole into a plurality of pixel islands arranged in an array and bridge regions connecting the pixel islands;

wherein each of the pixel islands comprises an island region driving circuit layer, the island region driving circuit layer is a region of the driving circuit layer which is located in the each of the pixel islands, and island region driving circuit layers are connected with each other by a lead in a corresponding one of the bridge regions;

wherein the side wall of the insulating planarization layer surrounds the island region driving circuit layers.

9. The method according to claim 8, wherein the at least one through hole penetrates through the substrate, and the side wall of the insulating planarization layer surrounds the at least one the through hole.

10. The method according to claim 8, wherein forming of the display layer further comprises:

forming a light-emitting unit layer on a side of the insulating planarization layer away from the driving circuit layer.

11. The method according to claim 10, wherein forming of the light-emitting unit layer comprises:

forming a first electrode layer on a surface of the insulating planarization layer away from the substrate;

forming a light-emitting layer on a surface of the first electrode layer away from the substrate; and forming a second electrode layer disposed on a surface of the light-emitting layer away from the substrate.

12. The method according to claim 11, wherein forming of the first electrode layer and forming of the light-shielding layer are completed in a same patterning process.

13. The method according to claim 12, wherein the first electrode layer and the light-shielding layer are made of a same material.

14. The method according to claim 13, the light-shielding layer is made of a material comprising at least one of silver and aluminum.

15. The method according to claim 14, further comprising:

forming an encapsulation layer disposed on a side of the light-emitting unit layer away from the substrate.

16. A display device, comprising a display panel, wherein the display panel comprises:

a substrate;

a display layer comprising a driving circuit layer and an insulating planarization layer covering the driving circuit layer which are stacked sequentially on the substrate, wherein the display layer is provided with at least one through hole penetrating through the display layer, and the insulating planarization layer has a side wall close to the at least one through hole; and a light-shielding layer covering at least partial region of the side wall of the insulating planarization layer;

wherein the substrate is made of a flexible material, the at least one through hole penetrate through the substrate, and the display panel is divided by the at least one through hole into a plurality of pixel islands arranged in an array and bridge regions connecting the pixel islands;

wherein each of the pixel islands comprises an island region driving circuit layer, the island region driving circuit layer is a region of the driving circuit layer which is located in the each of the pixel islands, and island region driving circuit layers are connected with each other by a lead in a corresponding one of the bridge regions;

wherein the side wall of the insulating planarization layer surrounds the island region driving circuit layers.

17. The display device according to claim 16, wherein the at least one through hole penetrates through the substrate, and the side wall of the insulating planarization layer surrounds the at least one the through hole.

* * * * *